(12) United States Patent  
Wang et al.

(10) Patent No.: US 8,237,125 B2
(45) Date of Patent: Aug. 7, 2012

(54) PARTICLE DETECTION SYSTEM

(75) Inventors: Yi-Xiang Wang, Fremont, CA (US); Joe Wang, Campbell, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 206 days.

(21) Appl. No.: 12/764,890

(22) Filed: Apr. 21, 2010

(65) Prior Publication Data

US 2011/0260069 A1    Oct. 27, 2011

(51) Int. Cl.
*G01T 1/28* (2006.01)

(52) U.S. Cl. .................................. 250/370.01

(58) Field of Classification Search ............... 250/307, 250/336.1, 370.01
See application file for complete search history.

(56) References Cited

U.S. PATENT DOCUMENTS

| 6,717,146 B2 * | 4/2004 | Chang et al. ............... 250/315.3 |
| 6,828,729 B1 * | 12/2004 | Owens et al. ................. 313/528 |
| 2001/0017344 A1 * | 8/2001 | Aebi ....................... 250/214 VT |

* cited by examiner

*Primary Examiner* — David Porta
*Assistant Examiner* — Marcus Taningco
(74) *Attorney, Agent, or Firm* — Stout, Uxa, Buyan & Mullins, LLP

(57) ABSTRACT

This invention provides a design to process a large range of detection beam current at low noise with a single detector. With such a design, the detection system can generate up to $10^{10}$ gain and maximum signal output at more than mini Ampere (mA) level.

18 Claims, 4 Drawing Sheets

PARTICLE DETECTION SYSTEM

FIELD OF THE INVENTION

The present invention relates to a particle detection system, and more particularly to an electron detection device used for a scanning electron microscope (SEM).

BACKGROUND OF THE INVENTION

Particle detection systems are used or applied in many facilities, such as electron beam system, scanning electron microscope (SEM), focused ion beam (FIB), mass spectrograph, or other facility necessary to detect particles with or without charge, photons.

Electron beam wafer inspection tool (EBWIT) needs large range of beam current to meet both high throughput (HT) mode and high resolution (HR) mode, in which the HT mode is driven by productivity and the HR mode is driven, on the opposite side, by design rule which now continues shrinking. The EBWIT usually uses several tens to several hundreds nA (nano Ampere) beam current for HT mode and uses several to several tens of pA (pico Ampere) beam current for HR mode. This requires the electron detector used in the EBWIT can handle the signal beam current (SE+BSE) from several tens of pA to several hundreds of nA. This requirement is a huge challenge for any current electron detection system existed nowadays.

Nowadays, there is no EBWIT that can be operated under both HT mode and HR mode; basically, HT mode is more popular due to the majority of the EBWIT detectors is SPD (semiconductor photodiode detector). For the HR mode, received detected current from specimen is too small for the SPD that output signal current, with about 2000 gain from the input signal current, is still a long way off to handle for the EBWIT.

Currently, semiconductor photo diode (SPD) is widely used for the EBWIT due to its low noise and potential of handling large beam current nature, such as several mA (mini Ampere). However, the gain obtained from SPD is very low (~2000 @ 10 KV) for pA detection current and not easy to be increased.

High gain, such as $10^4$-$10^7$, can be acquired from using Phosphor-PMT (phosphor multiplier tube) system and MCP (micro channel plate) detectors. However, most PMT and MCP can only output maximal several uA signal current, which can not meet the requirement of large beam current at low noise level, because the dynode in PMT limits the output current and the gain variation is too large when PMT dynode operates at low voltage. Further, although the Phosphor-PMT system can achieve high gain, but high bandwidth scintillator usually contributes high level white noise. However, if the image-average technique is used to eliminate the white noise, the throughput will be seriously hurt.

According to the above discussion, no detector system can output signal in the range from pA to mA. Thus, it is an important topic to formulate a particle detection system that can have a large range of gain and output signal current with low noise to meet both HT and HR modes requirement.

Further, in order to handle such a situation, Joe et al. suggested a Bi-Type detection system filed at Mar. 2, 2010 with application Ser. No. 12/715,766.

SUMMARY OF THE INVENTION

The present invention is directed to a particle detection system, which can detect charged or uncharged particles.

The present invention is also directed to an electron detection system, which gain of both electron detection system and particle detection system can be increased up to $10^{10}$ with mA output signal current.

The present invention is also directed to a scanning electron microscope can be applied as EBWIT to meet both HT mode and HR mode requirements.

In one embodiment, the particle detection system includes a charged particle multiplier device for receiving original particles to be detected and generating a plurality of charged particles to obtain a first level gain, and a charged particle detection device for receiving the plurality of charged particles and generating output signal corresponding to the original particles, wherein an electric potential is applied between the charged particle multiplier device and the charged particle detection device to accelerate the plurality of charged particles to arrive the charged particle detection device to obtain a second level gain.

In another embodiment, the electron detection system comprises a microchannel plate for receiving original electrons to be detected and generating a plurality of charged particles, and a semiconductor photodiode for receiving the plurality of charged particles and generating output signal corresponding to the original electrons, wherein an electric potential is applied between the microchannel plate and the semiconductor photodiode to accelerate the plurality of charged particles to arrive the semiconductor photodiode.

DETAILED DESCRIPTION OF THE INVENTION

The present invention provides a particle detection system. For complete understanding of the present invention, the following description will describe in detail the components. The present invention is not limited by the specified particulars of the particle detection system that are familiar to persons skilled in the art. In addition, well-known components are not described in detail so as to avoid any additional limitation. The preferable embodiments of the present invention are described in detail. In addition to the detailed descriptions, the present invention also can be applied to other embodiments. Therefore, the scope of the present invention is not limited, and is dependent on the following claims.

Figure 1:
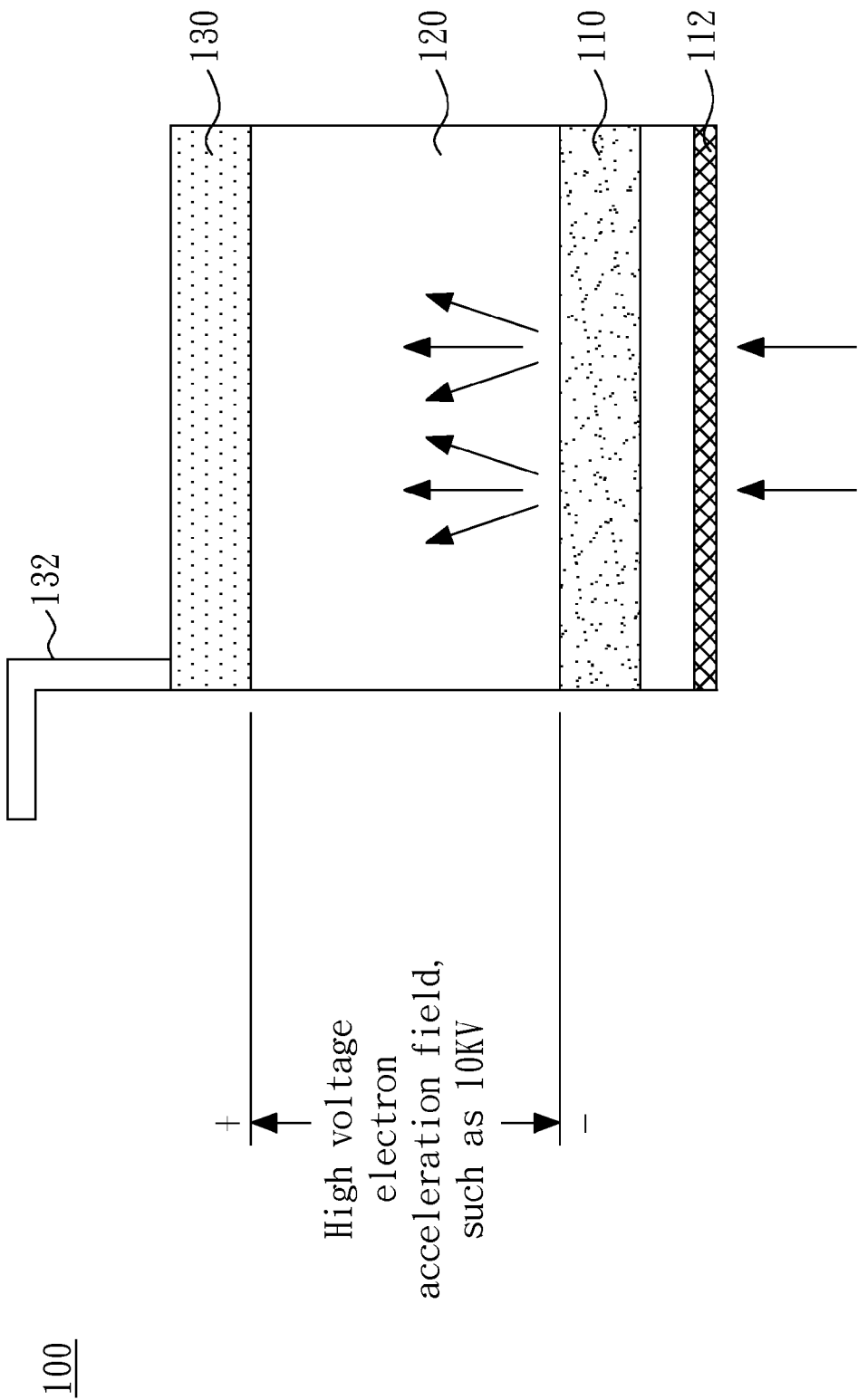
FIG. 1 is a schematic diagram for illustrating particle detection system according to an embodiment of the present invention.

Please refer to FIG. 1, wherein a particle detection system 100 comprises a charged particle multiplier device 110 for receiving original particles to be detected and then generating a plurality of charged particles and a charged particle detection device 130 for receiving the plurality of charged particles and generating an output signal corresponding to the original particles through a signal output interface 132. An electric field of electric potential within a drift tube type housing 120 is applied between the charged particle multiplier device 110 and the charged particle detection device to accelerate the plurality of charged particles to arrive the charged particle detection device 130. The original particles in this invention can include photons, and charged particles, wherein the charged particles may be ions, electrons, or other particle with positive charge or negative charge.

Figure 2:
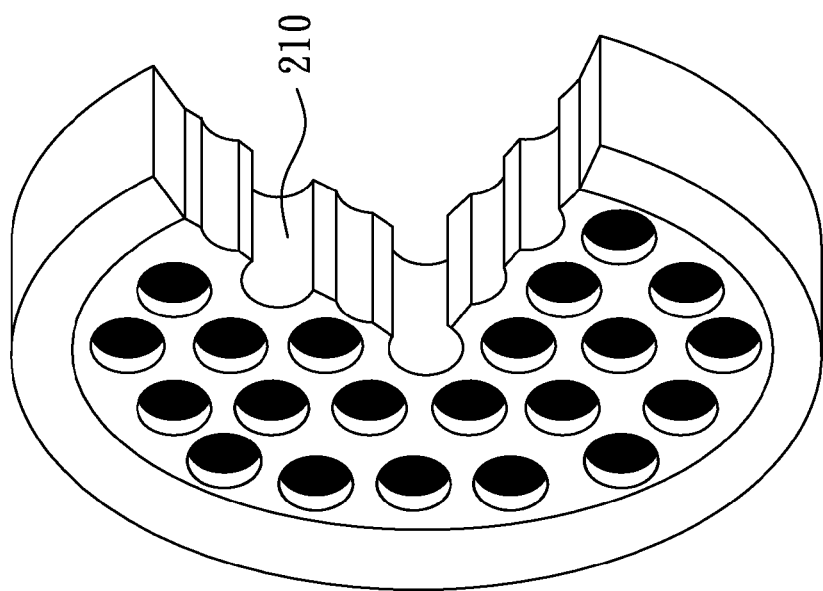
FIG. 2 is a schematic diagram for illustrating MCP inner structure.
Figure 3:
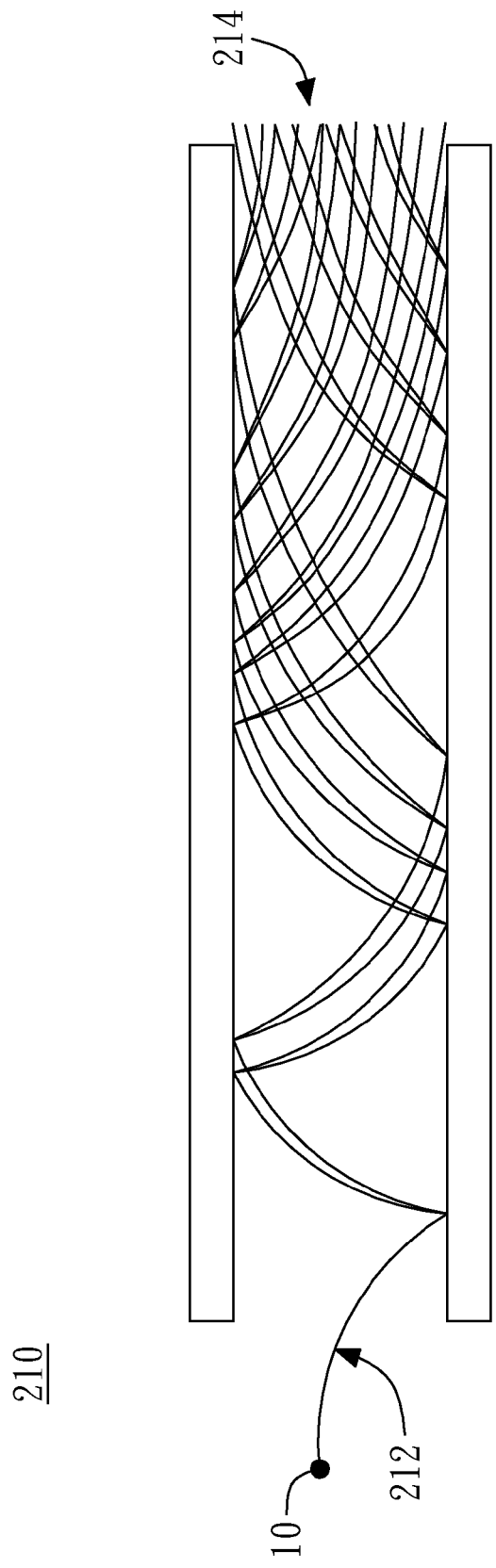
FIG. 3 is a schematic diagram for illustrating how one electron is amplified in one of the MCP.
Figure 4:
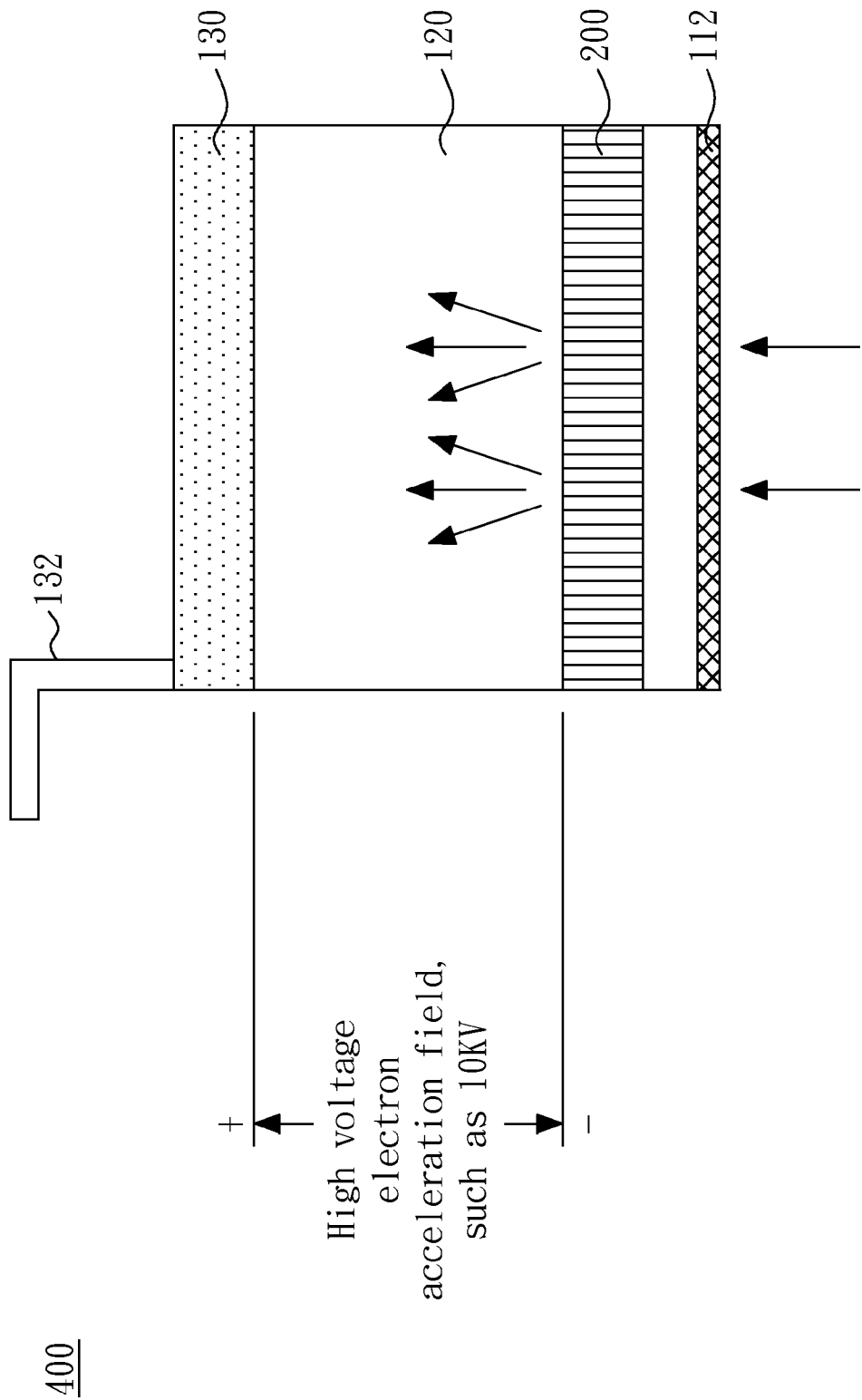
FIG. 4 is a schematic diagram for illustrating electron detection system according to an embodiment of the present invention.

Original particles to be detected are converted into charged particles, such as electrons, by the charged particle multiplier device 110 if the original particles are not charged. The charged particle multiplier device 110 for detecting the original particles, in one embodiment, can include a microchannel plate (MCP) (per se without anode), wherein the MCP is a two-dimensional sensor that can detect electrons, ions, UV rays, X-rays or gamma rays, and amplifies the detected signal. Details of the MCP can be referred to, for example the publication by Joseph I. Goldstein et al., Scanning Electron Microscopy and X-Ray Microanalysis, $2^{nd}$ edition, published by Plenum, 1992, Chapter 4, and can be referred to FIG. 2 and FIG. 3, wherein a schematic structure of a microchannel plate 200 is illustrated in FIG. 2 and a schematic structure of how one electron is amplified in one of the a plurality of microchannels is illustrated in FIG. 3. A plurality of microchannels is arrayed within a plate as shown in FIG. 2, wherein each channel 210, for example, will pass through the plate.

In FIG. 3, one electron 10 is injected into one channel 210 as input electrons 212, and then is reflected and amplified through the channel 210. A potential gradient is established along the channel 210 when a voltage is applied between input and output sides of the MCP. Multiple secondary electrons are emitted when one electron 10 enters a channel 210 from the input side and strikes its inner wall. These secondary electrons are accelerated by the potential gradient to draw parabolic trajectories that are determined by their inner velocities. They then strike the opposite wall in the channel 210 causing further secondary electrons to be emitted. The electrons in this way travel towards the output end while striking the inner wall of the channel 210 repeatedly. As a result, a large number of exponentially increased electrons as output electrons 214 are extracted to the charged particle detection device 130 by the electric field or potential between the charged particle multiplier device 110 and the charged particle detection device 130 from the output side.

The charged particle multiplier device 110 for detecting electrons, in one embodiment, can include an electron multiplier (per se or without anode), wherein the electron multiplier uses a vacuum-tube structure that multiplies incident charges. In a process called secondary emission, a single electron can, when bombarded on secondary emissive material, induce emission of roughly 1 to 3 electrons. If an electric potential is applied between this metal plate and another one, the emitted electrons will accelerate to the next metal plate and induce secondary emission of still more electrons. This can be repeated a number of times, resulting in a large shower of electrons all accelerated to the charged particle detection device 130 by the electric field or potential between the charged particle multiplier device 110 and the charged particle detection device 130.

The charged particle multiplier device 110 for detecting photons, in one embodiment, can include phosphor, a photocathode, and a microchannel plate or an electron multiplier, wherein the photocathode is used for transferring photons into charged particles, most electrons. When photons strike onto a surface of the photocathode, a negatively charged electrode in a light detection device, a plurality of electrons are emitted and then accelerated to the charged particle detection device 130 by the electric field or potential between the charged particle multiplier device 110 and the charged particle detection device 130. The electron emission, can be current amplifier, from the photocathode is then forward to the electron multiplier for multiplying incident charges.

One important function of the charged particle multiplier device 110 is to acquire the first level gain, and the charged particle detection device 130 is to acquire a second level gain. Further, the function of the charged particle detection device 130 can generate a large output signal current (more than 0.1 mA) with low noise level. The charged particle detection device 130, in one embodiment, can be semiconductor photodiode detector, such as PiN photodiodes.

The drift tube type housing 120 between the charged particle multiplier device 110 and the charged particle detection device 130 is used for confining charged particles generated by the charged particle multiplier device 110. The electric field or potential applied between the charged particle multiplier device 110 and the charged particle detection device 130 can be high voltage, such as ±1 KV to ±20 KV or above/below, to accelerate the charged particles. Because gain of the semiconductor photodiode detectors depends on landing energy of the charged particles, adjusting this applied electric field or potential can increase gain of the charged particle detection device 130 significantly, which is impossible in the prior arts. Further, white noise issue in the Phosphor-PMT does not appear in the design.

The output signal in the signal output interface 132, forward to an amplifier in which transferred from current signal to voltage signal. The particle detection system 100 obtains maximum gain up to $10^{10}$ with maximum output signal current more than mA level, in one embodiment with 10 KV applied electric field or potential. This distinct performance would be impossible for any prior particle detection system.

A metal mesh 112, which is an optional part, can be placed within the drift tube hosing 120 and in front of an incident surface of the charged particle multiplier device 110 for preventing the leakage of the electric field or potential applied on the charged particles multiplier device 130.

One important application of the particle detection system is to detect electrons. An electron detection system 400 includes a metal mesh 112, a MCP 200, a drift tube type housing 120, a charged particle detection device 130, such as PiN photodiode detector, and a signal output interface 132. The MCP 200, in one embodiment, attracts original particle, for example about 10 nA electrons and amplifies these electrons to a first level gain, for example 1000 times gain. And, these amplified electrons will be accelerated by a 10 KV electric field or potential within the drift tube type housing 120. The charged particle detection device 130, which in one embodiment uses SPD or PiN photodiode detector, will obtain about 2000 times gain with about 20 mA output signal. Compared with a multi-stage MCP assembly with maximum 10 to 20 uA output signal current (about 2K gain), this invention can provide maximum 10 to 20 mA output signal current (about 2 million gain). The later which is thousand times larger. In theory MCP has the capability to obtain 2 million gain, but output current of anode is limited to 20 uA. Therefore, real value of multi-stage MCP assembly can only obtain 1K to 2K gain for the 10 nA signal current.

The design of this invention can detect not only electrons or charged particles, but also photons or even other neutral particles. The charged particle multiplier device provides a first gain level and a function to convert original particles into charged particles if the original particles are electric neutral. An applied electric field or potential between the charged particle multiplier device and the charged particle detection device can increase gain of the charged particle detection device, and a second gain level is obtained in this design. Further, by using the electric field or potential, the particle detection system can increase gain compared to or larger than the multi-stage MCP assembly, with thousand times larger output signal current than the multi-stage MCP assembly.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A particle detection system comprising:
    a charged particle multiplier device for receiving original particles to be detected and generating a plurality of charged particles with a first level gain;
    a charged particle detection device for receiving the plurality of charged particles and generating output signal corresponding to the original particles; and
    a drift tube type housing enclosing the charged particle multiplier device and the charged particle detection device;
    wherein an electric potential is applied between said charged particle multiplier device and said charged particle detection device to accelerate the plurality of charged particles to arrive said charged particle detection device to obtain a second level gain.

2. The particle detection system according to claim 1, wherein said charged particle detection device is a semiconductor photo diode.

3. The particle detection system according to claim 2, wherein said original particles are charged.

4. The particle detection system according to claim 3, wherein said charged particle multiplier device is a microchannel plate.

5. The particle detection system according to claim 4, wherein gain of the particle detection system can be adjusted by the microchannel plate.

6. The particle detection system according to claim 3, wherein said original particles are electrons.

7. The particle detection system according to claim 6, wherein said charged particle multiplier device is an electron multiplier.

8. The particle detection system according to claim 2, wherein said original particles are photons.

9. The particle detection system according to claim 8, wherein said charged particle multiplier device includes phosphor, photo cathode, and a microchannel plate.

10. The particle detection system according to claim 8, wherein said charged particle multiplier device includes phosphor, photo cathode, and an electron multiplier.

11. The particle detection system according to claim 1, wherein gain of the particle detection system can be adjusted by the electric potential.

12. The particle detection system according to claim 11, wherein the electric potential can be ranged from 5 KV to 15 KV.

13. The particle detection system according to claim 1, further comprising a metal mesh placed in front of said charged particle multiplier device.

14. An electron detection system, comprising:
    a microchannel plate for receiving original electrons to be detected and generating a plurality of charged particles;
    a semiconductor photodiode for receiving the plurality of charged particles and generating output signal corresponding to the original electrons; and
    a drift tube type housing enclosing the charged particle multiplier device and the charged particle detection device;
    wherein an electric potential is applied between said microchannel plate and said semiconductor photodiode to accelerate the plurality of charged particles to arrive said semiconductor photodiode.

15. The electron detection system according to claim 14, wherein gain of the electron detection system can be adjusted by the electric potential.

16. The electron detection system according to claim 15, wherein the electric field can be ranged from 5 KV to 15 KV.

17. The electron detection system according to claim 16, further comprising a metal mesh placed in front of said microchannel plate.

18. The electron detection system according to claim 14, wherein gain of the electron detection system can be adjusted by the microchannel plate.

* * * * *